United States Patent
Nakamura

(10) Patent No.: US 9,583,391 B2
(45) Date of Patent: Feb. 28, 2017

(54) WAFER PROCESSING METHOD

(71) Applicant: DISCO CORPORATION, Tokyo (JP)

(72) Inventor: Masaru Nakamura, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/202,142

(22) Filed: Jul. 5, 2016

(65) Prior Publication Data

US 2017/0011965 A1    Jan. 12, 2017

(30) Foreign Application Priority Data

Jul. 6, 2015 (JP) .................................. 2015-135531

(51) Int. Cl.
*H01L 21/00* (2006.01)
*H01L 21/78* (2006.01)
*B23K 26/00* (2014.01)

(52) U.S. Cl.
CPC .......... *H01L 21/78* (2013.01); *B23K 26/0006* (2013.01); *B23K 26/0057* (2013.01); *B23K 26/53* (2015.10); *B23K 2203/56* (2015.10)

(58) Field of Classification Search
None
See application file for complete search history.

(56) References Cited

U.S. PATENT DOCUMENTS

| 8,815,644 B2* | 8/2014 | Priewasser | H01L 21/784 |
| | | | 438/114 |
| 2013/0012000 A1* | 1/2013 | Fujii | B23K 26/0057 |
| | | | 438/462 |
| 2015/0056785 A1* | 2/2015 | Fujii | B23K 26/0057 |
| | | | 438/463 |

FOREIGN PATENT DOCUMENTS

WO    WO 03/077295 A1    9/2003

* cited by examiner

*Primary Examiner* — Angel Roman
(74) *Attorney, Agent, or Firm* — Greer Burns & Crain, Ltd.

(57) ABSTRACT

There is provided a wafer processing method including a modified layer forming step. In the wafer processing method, the power of a pulse laser beam set in the modified layer forming step is set to a power that forms modified layers and cracks in such a manner that a wafer is allowed to be divided into individual device chips before the thickness of the wafer reaches a finished thickness and, after the wafer is divided into the individual device chips, the time until the thickness of the wafer reaches the finished thickness is such a time that damage due to rubbing of the individual device chips against each other is not caused through grinding under a predetermined grinding condition set in a back surface grinding step.

1 Claim, 6 Drawing Sheets

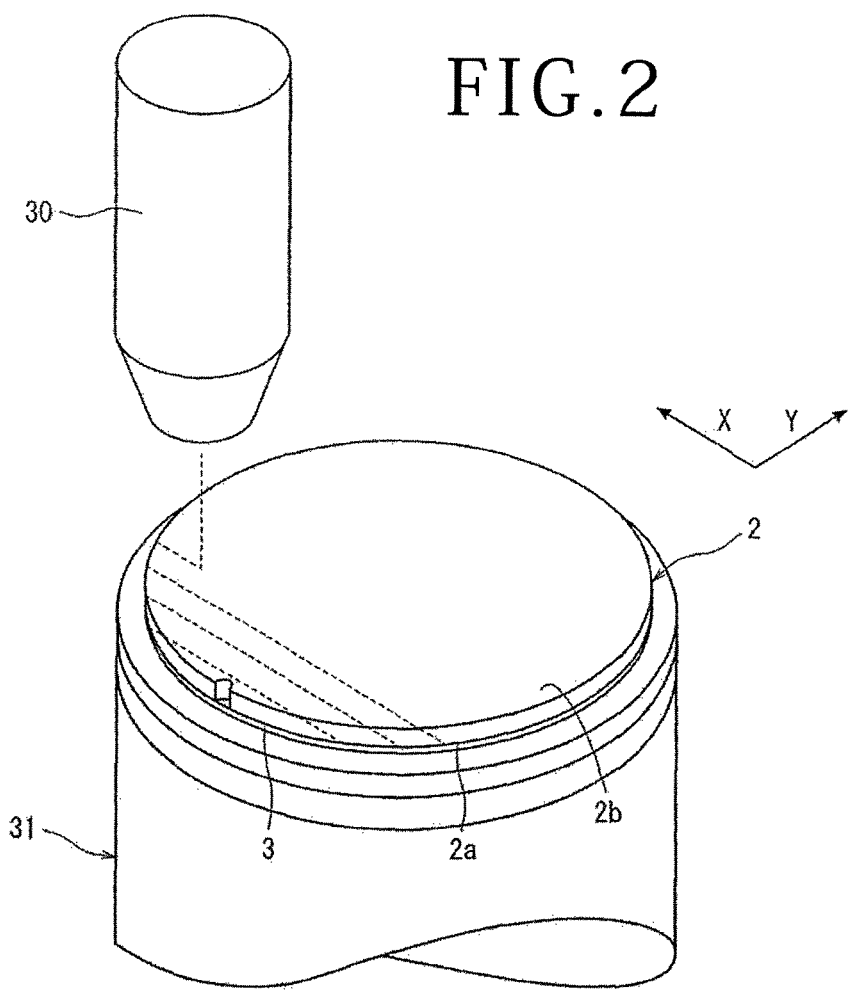
FIG.2
FIG.3A  FIG.3B
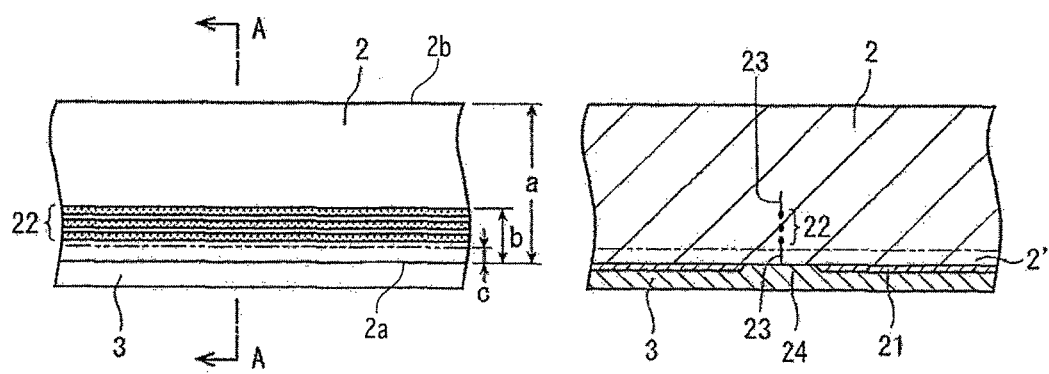

WAFER PROCESSING METHOD

BACKGROUND OF THE INVENTION

Field of the Invention

The present invention relates to a wafer dividing method for diving, along plural streets (planned dividing lines), a wafer on which these plural streets are formed in a lattice manner on the front surface and devices are formed in plural regions marked out by the plural streets.

Description of the Related Art

In a semiconductor device manufacturing processing, plural regions are marked out by planned dividing lines that are arranged in a lattice manner on the front surface of a semiconductor wafer having a substantially circular disc shape and are called streets, and devices such as integrated circuits (ICs) and large scale integrations (LSIs) are formed in these marked-out regions. Then, the wafer is cut along the streets to divide the regions in which the devices are formed and manufacture the individual device chips.

As a method for dividing along the streets of the above-described wafer, a laser processing method is also attempted in which a pulse laser beam having such a wavelength as to be transmitted through the wafer is used and the wafer is irradiated with the pulse laser beam, with the light focus point set inside the region along which the dividing should be performed.

One example of the dividing method using this laser processing method will be described more specifically. A protective member is disposed on the wafer front surface on which devices are formed, and the wafer is irradiated with the laser beam having such a wavelength as to be transmitted through the wafer from the back surface of the wafer, with the light focus point positioned at the inside of the wafer corresponding to the planned dividing line, to form modified layers along the planned dividing lines. Thereafter, the side of the protective member disposed on the front surface of the wafer is held by a holding unit and the back surface of the wafer is ground by a grinding unit to process the wafer to a target finished thickness. By this processing, the modified layers are removed and the wafer is divided into the individual device chips along the planned dividing lines (for example, refer to Japanese Patent No. 3762409). According to this dividing step, cracks are formed when the modified layers are formed. Thereafter, by carrying out the grinding by the grinding unit, the wafer is divided into the individual device chips, with these cracks serving as the origin of the dividing. Thus, the wafer can be efficiently divided without the need to take a measure such as additionally applying an external force.

SUMMARY OF THE INVENTION

The above-described modified layers and cracks are formed by making a condition under which multi-photon absorption easily occurs by carrying out the irradiation, with the light focus point of the pulse laser beam set inside the wafer substrate, and modifying the inside of the wafer substrate. The cracks are formed in the process of the above-described modified layer formation. Due to the existence of these cracks at the time of the grinding, the wafer is surely divided into the individual device chips in the grinding step of grinding the back surface of the wafer substrate.

However, at the time of the grinding of the back surface, as described later, while a chuck table that holds the wafer as the processing-target object rotates, a grinding wheel included in the grinding unit rotates at high speed in contact with this wafer and this grinding unit descends toward the processing-target object. This gives strong pressure and vibration to the wafer. Furthermore, the following problem occurs if the grinding step is continued for a long time until the thickness of the wafer reaches the finished thickness after the wafer is divided into the individual device chips in the middle of the grinding step. Specifically, the divided device chips receive the above-described pressure and vibration and each vibrate, and the adjacent device chips get contact with and collide with each other. Thus, chipping occurs at the side parts and corner parts of the device chips, which causes a large influence on the product quality.

It is conceivable that the following countermeasure is employed in order to cope with this problem.

Specifically, when a protective film as a protective member is disposed on the front surface of the wafer on which devices are formed in order to carry out grinding processing, this protective film is hardened to strongly fix device chips so that the device chips may be prevented from vibrating after the respective devices are divided into the individual chips. However, this protective film is required to have a function as a certain level of buffering material so as to absorb the vibration in the processing in order to protect the devices on the front surface side when the front surface side of the wafer, on which the devices are formed, is held on a holding member such as a chuck table. Thus, it is not preferable to preliminarily harden the protective film to such a state that each device chip after the dividing is strongly fixed.

Therefore, an object of the present invention is to provide a wafer processing method that does not cause the lowering of the quality of device chips in the case in which a grinding step is carried out to divide a wafer into the individual device chips after formation of modified layers and cracks by a pulse laser beam.

In accordance with an aspect of the present invention, there is provided a wafer processing method for dividing a wafer on which a plurality of devices are formed on a front surface and are marked out by planned dividing lines into individual device chips. The wafer processing method includes a protective member disposing step of disposing a protective member on the front surface of the wafer and a modified layer forming step of positioning a light focus point of a pulse laser beam having such a wavelength as to be transmitted through the wafer on which the protective member is disposed at the inside of the wafer along the planned dividing lines and irradiating the wafer with the pulse laser beam with predetermined power to form modified layers and cracks extending from the modified layers toward the front surface and a back surface. The wafer processing method further includes a back surface grinding step of, after carrying out the modified layer forming step, holding the side of the protective member on a chuck table and grinding the back surface of the wafer by a grinding wheel under a predetermined grinding condition to divide the wafer into the individual device chips and carrying out grinding until the modified layers are removed and the thickness of the wafer reaches a target finished thickness. The predetermined power of the pulse laser beam set in the modified layer forming step is set to power that forms the modified layers and the cracks in such a manner that the wafer is allowed to be divided into the individual device chips before the thickness of the wafer reaches the target finished thickness and, after the wafer is divided into the individual device chips, the time until the thickness of the wafer reaches the target finished thickness is such a time that damage due to rubbing of the individual device chips against each other is not caused through grinding under the predetermined grinding condition set in the back surface grinding step.

According to the wafer processing method of the present invention, the power of the pulse laser beam that forms the modified layers and the cracks is set to satisfy the following condition. Specifically, the wafer is prevented from being divided into the individual device chips for a while in the progression of grinding after grinding processing is started in the back surface grinding step, and the timing of the dividing is immediately before the thickness of the wafer reaches the finished thickness. Furthermore, after the wafer is divided into the individual device chips, the time until the thickness of the wafer reaches the finished thickness is such a time that damage due to rubbing of the individual device chips against each other is not caused.

The above and other objects, features and advantages of the present invention and the manner of realizing them will become more apparent, and the invention itself will best be understood from a study of the following description and appended claim with reference to the attached drawings showing a preferred embodiment of the invention.

BRIEF DESCRIPTION OF THE DRAWINGS

FIG. 2 is a schematic perspective view showing the execution state of a modified layer forming step;

FIG. 3A and FIG. 3B are sectional views showing modified layers formed in the modified layer forming step shown in FIG. 2;

DETAILED DESCRIPTION OF THE PREFERRED EMBODIMENT

A preferred embodiment of a wafer processing method according to the present invention will be described in detail below with reference to the accompanying drawings.
(Protective Member Disposing Step)

Figure 1A:
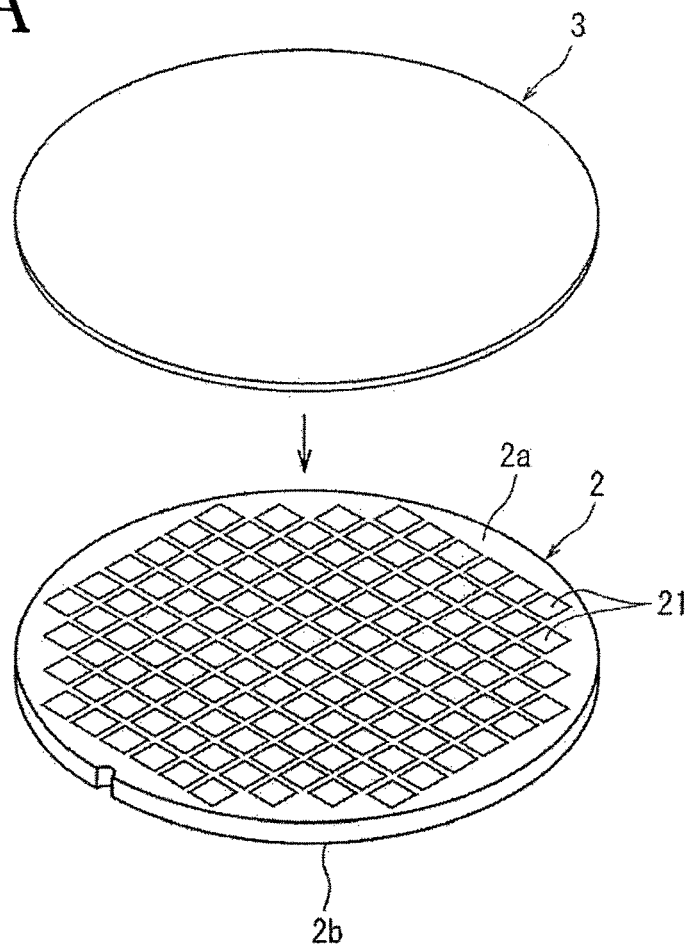
FIG. 1A and FIG. 1B are schematic perspective views showing a protective member disposing step.
Figure 1B:
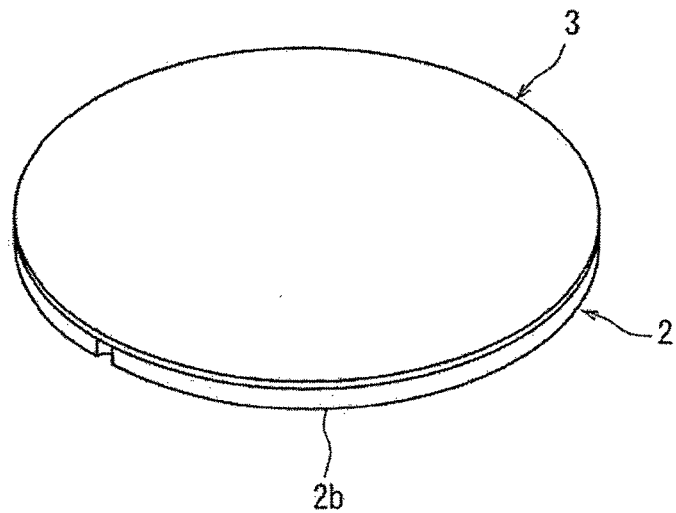

In FIG. 1A and FIG. 1B, a step of forming a wafer as a processing-target object (see FIG. 1B) by sticking a silicon wafer 2 to be divided by the wafer processing method according to the present invention and a protective tape 3 composed of e.g. vinyl chloride as a protective member to protect devices 21 formed on a front surface 2a side of this silicon wafer 2 (see FIG. 1A) is shown. On the silicon wafer 2 shown in FIG. 1A, plural regions are marked out by plural streets (planned dividing lines) formed in a lattice manner on the front surface 2a and the devices 21 such as ICs and LSIs are formed in these marked-out regions.
(Modified Layer Forming Step)

After the protective tape 3 is disposed on the front surface 2a of the silicon wafer 2 as described above, the side of the protective tape 3 on the silicon wafer 2 is positioned and placed on a chuck table 31 for laser processing in laser processing apparatus like one shown in FIG. 2. Then, the silicon wafer 2 is irradiated with a laser beam having such a wavelength as to be transmitted through this silicon wafer 2 from the side of a back surface 2b of the wafer 2, with the light focus point positioned at the inside of the wafer 2 corresponding to the planned dividing line, and processing feeding of the chuck table 31 is carried out in a direction indicated by an arrow X at a predetermined processing feed speed to be described later to form a modified layer.

After the above-described laser processing is finished over the entire length of this planned dividing line, indexing feeding of a light collector 30 that emits the laser beam is sequentially carried out in a direction indicated by an arrow Y relatively, and the chuck table 31 is moved in the direction of the arrow X while the wafer 2 is irradiated with the pulse laser beam. Modified layers are thereby formed at the whole of the inside of the silicone wafer 2 corresponding to the planned dividing lines that are arranged in the direction of the arrow Y and extend along a first direction on the silicon wafer 2. Thereafter, the chuck table 31 is rotated by 90 degrees and the same procedure is repeated regarding the planned dividing lines extending along a second direction orthogonal to the first direction. Modified layers and cracks are thereby generated at the whole of the inside of the silicone wafer 2 corresponding to the planned dividing lines arranged in the first direction and the second direction of the silicon wafer 2. In this embodiment, three modified layers whose positions are displaced in the height (depth) direction are formed along one planned dividing line. Therefore, this modified layer forming step is repeated while the position of the light focus point is displaced three times regarding each planned dividing line.

The modified layers formed in the above-described modified layer forming step will be further described by using FIG. 3A and FIG. 3B. FIG. 3A shows a partial schematic diagram of a section obtained by cutting the wafer 2 in which the modified layers are formed along the planned dividing line. The silicon wafer 2 is formed with a thickness of $a=700$ μm and the modified layers are formed in a region obtained by excluding a region of $c=30$ μm from the front surface 2a to a height indicated by a two-dot chain line, set as a target finished thickness in a back surface grinding step to be described later, from a range b set to 180 μm on the basis of the front surface 2a, on which the devices 21 are formed. FIG. 3B is a partial schematic diagram of a section along line A-A obtained by cutting along the direction orthogonal to modified layers 22 shown in FIG. 3A. The modified layers 22 are formed inside along a planned dividing line 24 and cracks 23 are formed on the upper and lower sides of these modified layers 22.
(Back Surface Grinding Step)

Figure 4:
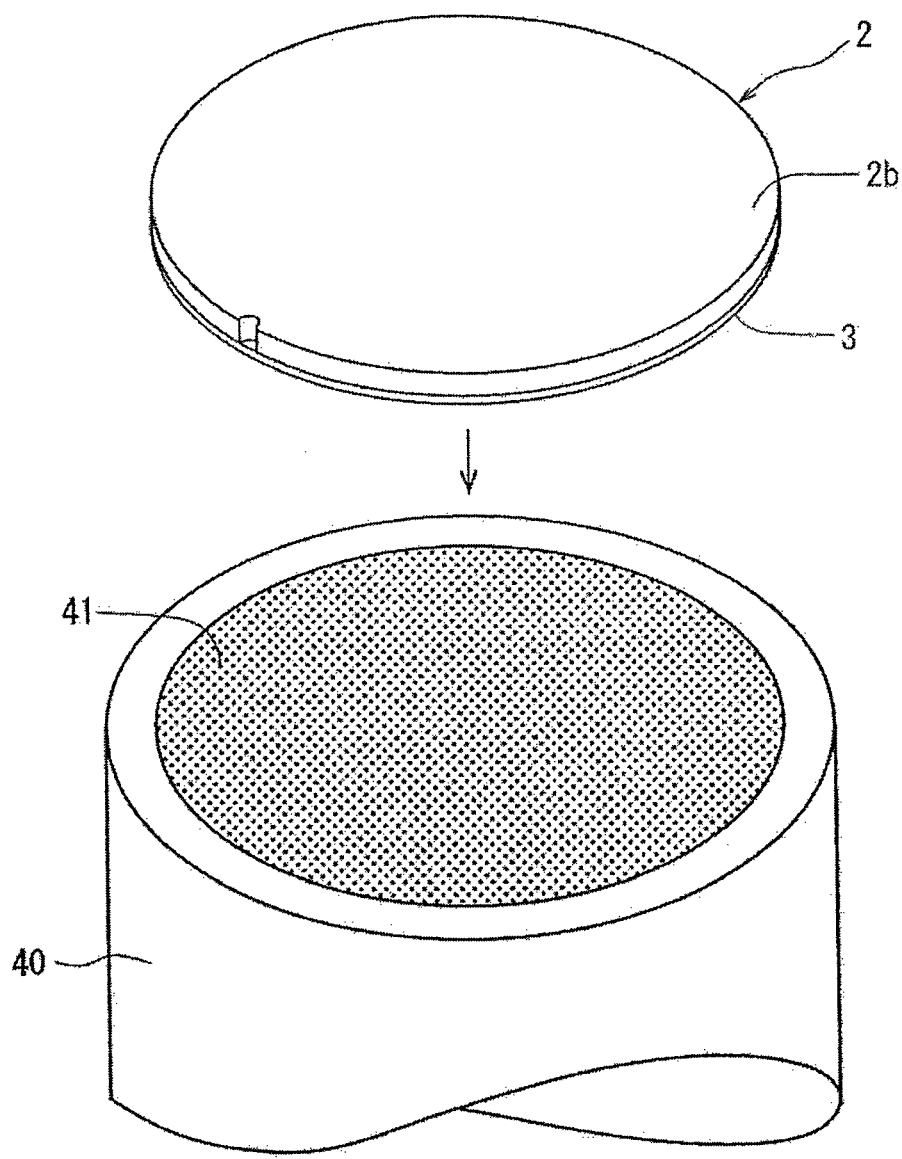
FIG. 4 is a perspective view showing a wafer holding step at the time of back surface grinding of a wafer.

After the modified layers 22 are formed inside the wafer 2 along all planned dividing lines 24 by the above-described modified layer forming step, as shown in FIG. 4, the above-described silicon wafer 2 is placed on a chuck table 40 rotatably configured in grinding apparatus in such a manner that the side of the protective tape 3 of this wafer 2 is set as the lower side, i.e. the side of the back surface 2b is set as the upper surface side. The upper surface of this chuck table 40 is formed of an adsorption chuck 41 composed of porous ceramic through which air can pass. Furthermore, suction is carried out by a suction unit (not shown) and the silicon wafer 2 is strongly held.

Figure 5:
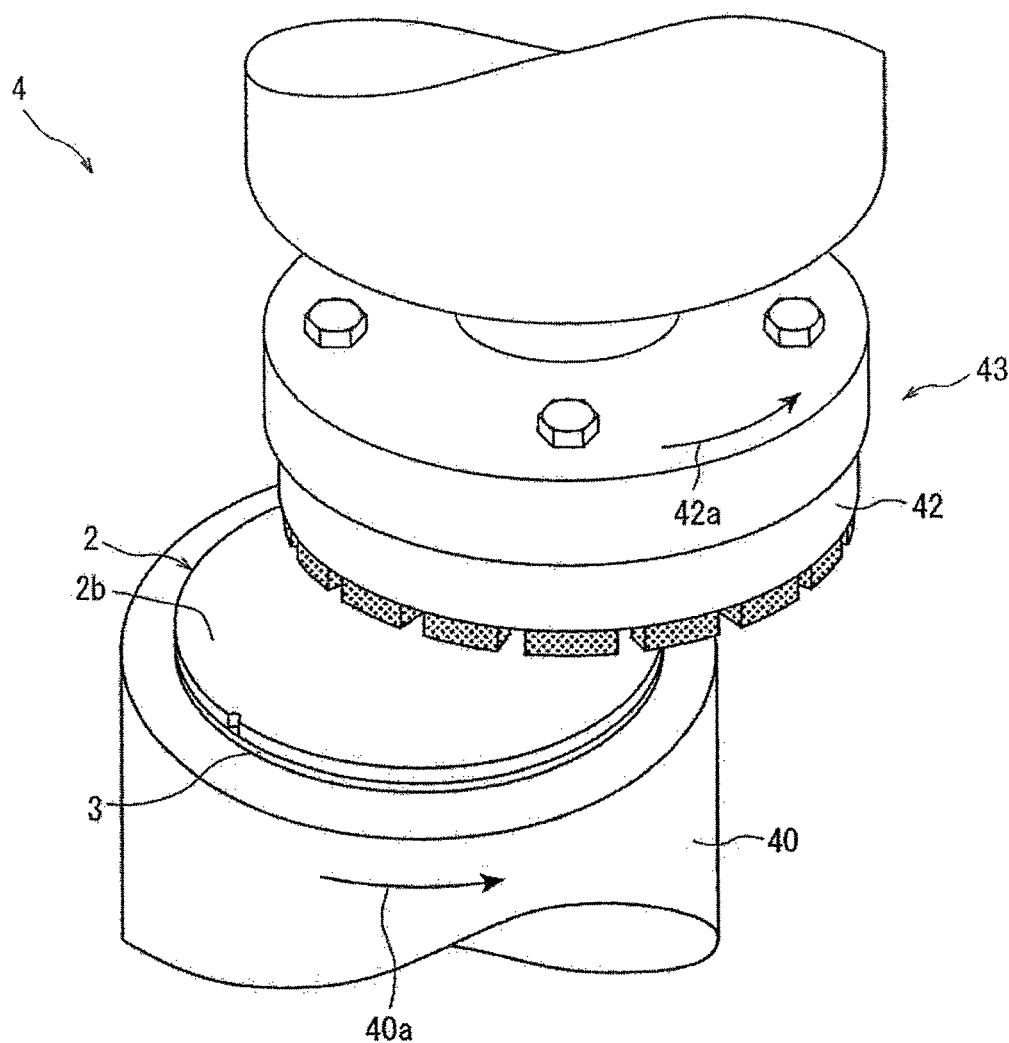
FIG. 5 is a schematic perspective view showing a back surface grinding step.
Figure 6:
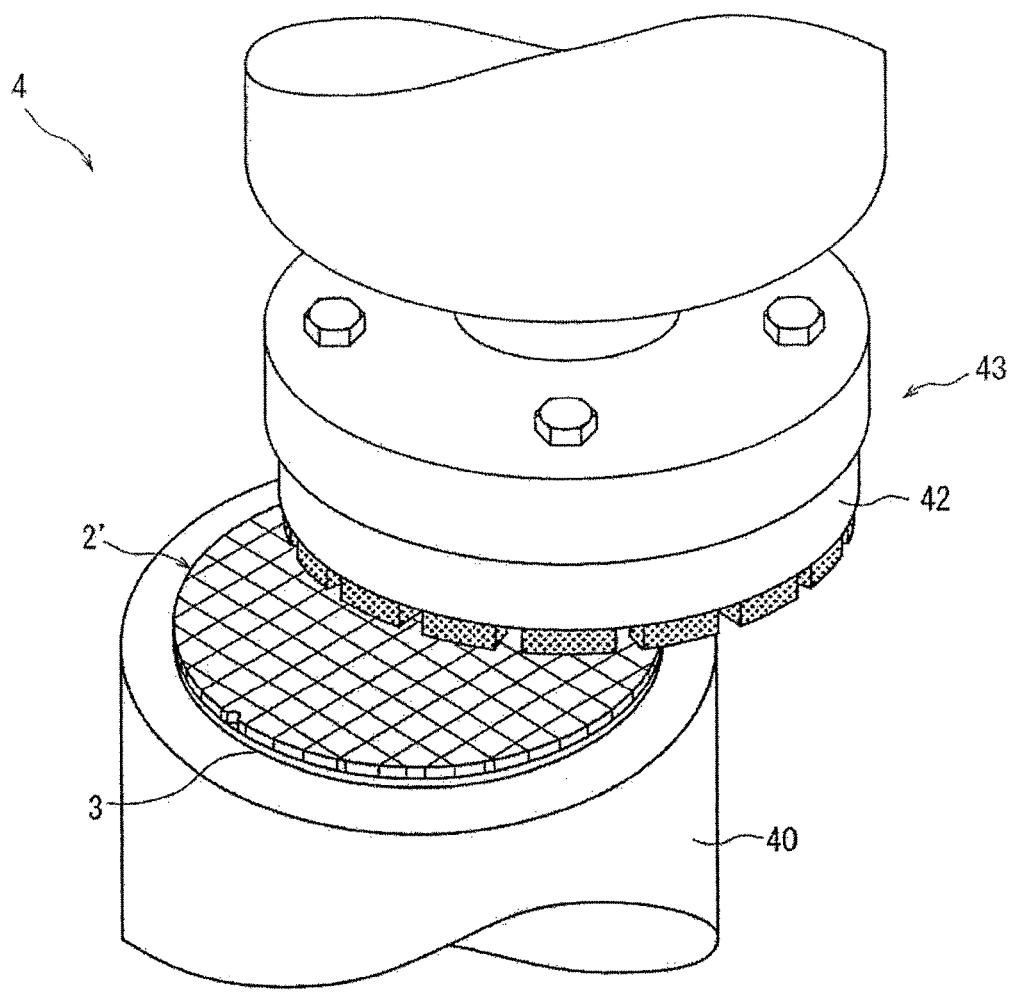
FIG. 6 is a schematic perspective view showing the grinding processing completed state in the back surface grinding step.

After the silicon wafer 2 is held on the chuck table 40, as shown in FIG. 5, while the chuck table 40 is rotated in a direction shown by an arrow 40a at 300 rpm for example, a grinding wheel 42 of a grinding unit 43 is rotated in a direction of an arrow 42a at 3500 rpm for example. Furthermore, grinding is carried out by grinding abrasives of the grinding wheel 42 while the grinding wheel 42 is made to descend at a speed of 1.0 µm/second. The silicon wafer 2 is thereby formed into the above-described target finished thickness (30 µm). When the thickness of the silicon wafer 2 reaches the target finished thickness, the modified layers 22 are all removed and a silicon wafer 2' that has become the state in which the respective devices 21 are divided along the cracks 23 formed by the modified layer forming step is obtained, so that the back surface grinding step ends (see FIG. 6).

Figure 7:
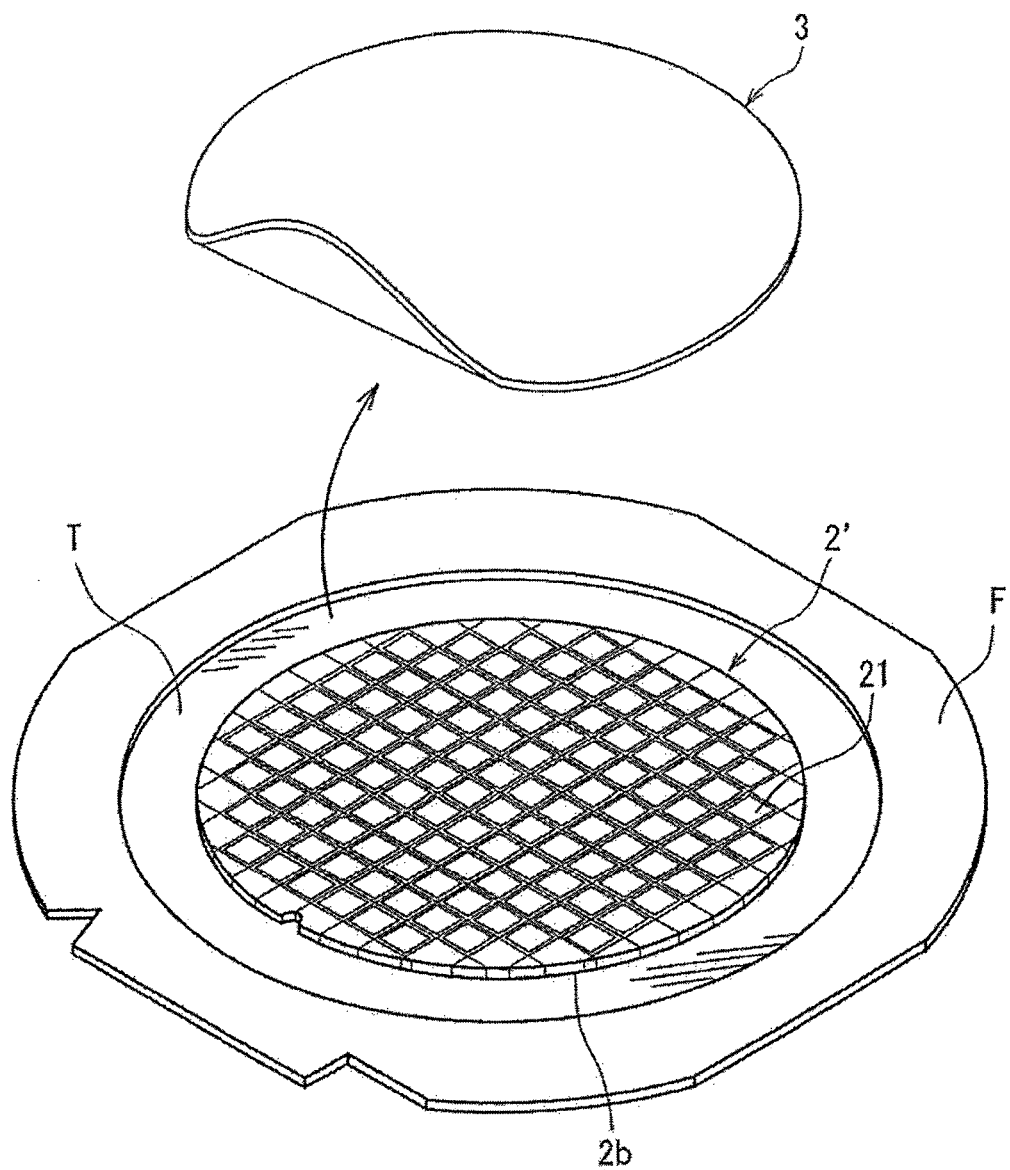
FIG. 7 is a schematic perspective view showing a step of separating a protective tape.

Through the above, the processing step relating to the dividing of the silicon wafer 2 ends. The side of the back surface 2b of the silicon wafer 2' after the end of the wafer processing is stuck to a tape T held by a frame F to integrate the silicon wafer 2' and the tape T. Thereafter, the protective tape 3 is separated as appropriate (see FIG. 7) and the individual device chips are picked up from the tape T.

The inventor of the present invention has made thorough studies on the sizes of modified layers and cracks generated as the result of the above-described modified layer forming step and the occurrence of defects in the individual device chips caused by the back surface grinding step carried out after the modified layer forming step. As a result, the inventor has found the following fact. Specifically, if the individual devices are divided into chips at an early timing by the back surface grinding step, the grinding time after the dividing is long and adjacent device chips collide with and rub against each other in the back surface grinding step after the dividing, which causes damage relating to the product quality. Furthermore, the inventor has derived the following conclusion. Specifically, the timing when the wafer is divided into the respective device chips is affected by the sizes of the modified layers and the cracks formed in the modified layer forming step and the sizes of the modified layers and the cracks are dominated by the power of the pulse laser beam per one pulse. Details thereof will be described below.

The processing condition of the laser processing used in this modified layer forming step is as follows.
Light source: LD-excited Q-switch Nd:YVO4 pulse laser
Wavelength: 1342 nm
Repetition frequency: 60 kHz
Spot of light focus point: ϕ 1.0 µm
Processing feed speed: 500 mm/second
Processing-target object: silicon wafer
Thickness: 700 µm
Range of formation of modified layers: 45 µm to 180 µm (range is based on the front surface 2a of the silicon wafer 2 and three modified layers are formed)

As the grinding condition in the back surface grinding step, as described above, while the chuck table 40 was rotated in the direction shown by the arrow 40a at 300 rpm for example, the grinding wheel 42 of the grinding unit 43 was rotated in the direction of the arrow 42a at 3500 rpm for example, and the grinding wheel 42 was made to descend at a speed of 1.0 µm/second.

For execution of the above-described modified layer forming step and back surface grinding step, the relation between the development status of the modified layers 22 and the cracks 23 by the modified layer forming step and the occurrence status of defects in the devices 21 due to the back surface grinding step was examined with change in only the power of the pulse laser beam. The result of the examination is shown below. As the conditions about whether or not the devices 21 were favorable, the following condition was deemed as the OK condition and the other conditions were deemed as NG. Specifically, in the state in which the thickness of the wafer 2 had reached the target finished thickness by the grinding step, the wafer 2 was completely divided into the individual device chips and the side surface and corner part of each divided device chip were not chipped to a depth equal to or larger than 5 µm.

| [Average output] | [Power] | [Modified layer] | [Crack] | [Whether or not device chips are favorable] |
|---|---|---|---|---|
| 0.1 W | 0.16 | 0 | 0 | NG (wafer could not be divided) |
| 0.2 W | 0.33 | 0 | 0 | NG (wafer could not be divided) |
| 0.3 W | 0.5 | 5 | 0 | NG (wafer could not be divided) |
| 0.4 W | 0.67 | 10 | 5 | OK |
| 0.5 W | 0.83 | 15 | 7 | OK |
| 0.6 W | 1.0 | 20 | 9 | OK |
| 0.7 W | 1.17 | 30 | 20 | NG (chipping was found) |
| 0.8 W | 1.33 | 35 | 30 | NG (chipping was found) |
| 0.9 W | 1.5 | 40 | 35 | NG (chipping was found) |
| 1.0 W | 1.67 | 45 | 40 | NG (chipping was found) |

* [Power] denotes the power of the pulse laser beam per one pulse and the unit thereof is [$10^{-5}$ J/one pulse]and the unit of the length of [Modified layer] and [Crack] is [µm]. The length of [Modified layer] indicates the height in the depth direction per one layer.

As described above, when the power of the pulse laser beam was equal to or lower than 0.33 [$10^{-5}$ J/one pulse], the modified layers and the cracks were not generated in the measurable range and the dividing was not favorably made even after the back surface grinding step was carried out and the wafer was ground to the target finished thickness. Furthermore, in the case of 0.5 [$10^{-5}$ J/one pulse], although the modified layers were formed, the cracks were not formed in the measurable range and the dividing was not favorably made similarly to the above. Moreover, when the power of the pulse laser beam in the modified layer forming step was equal to or higher than 1.17 [$10^{-5}$ J/one pulse], the modified layers and the cracks became large beyond necessity and the wafer was divided into the individual device chips at an early stage of the back surface grinding step, with the cracks serving as the origin of the dividing. Thus, chipping that could not be permitted was caused at the side surfaces and corner parts of the individual device chips due to pressure and vibration in the back surface grinding step.

In contrast, the following fact was found. Specifically, when the formation of the modified layers was carried out in a range of 0.67 to 1.0 [$10^{-5}$ J/one pulse] as the range of the power of the pulse laser beam, the dividing into the individual device chips was suppressed until immediately before the wafer thickness reached the target finished thickness in the back surface grinding step. In addition, after the wafer was surely divided into the individual device chips due to the effect of the modified layers and the cracks, the time until the wafer thickness reached the target finished thickness was a time of such a length that damage due to rubbing of the individual device chips against each other was not caused. From this examination result, the following fact can be understood. Specifically, the lengths of the modified layers and the cracks can be adjusted by adjusting the power of the pulse laser beam used in the modified layer forming step. By adjusting these lengths of the modified layers and the cracks, the timing of the dividing into the individual device chips in the back surface grinding step can be adjusted. By adjusting this dividing timing, the time until the thickness of the silicon wafer 2 reaches the target finished thickness after the silicon wafer 2 is divided into the individual device chips can be controlled.

That is, in the case of forming modified layers and cracks by a pulse laser beam to a silicon wafer and then carrying out the back surface grinding step to divide the silicon wafer into the individual device chips and remove the modified layers, the sizes of the modified layers and the cracks are so envisaged that this wafer can be divided into the individual device chips before the thickness of the wafer reaches the target finished thickness and, after the wafer is divided into the individual device chips, the time until the thickness of the wafer reaches the target finished thickness is such a time that damage due to rubbing of the individual device chips against each other is not caused through grinding under a predetermined grinding condition set in the back surface grinding step. Furthermore, regarding the laser beam with which the wafer is irradiated in the modified layer forming step, the power of the laser beam that provides these sizes of the modified layers and the cracks is set. This can solve the above-described problem of the present invention.

The relationship between the lengths of the modified layers and the cracks, which change depending on the power of the above-described pulse laser beam, and the timing when the wafer is divided and the time until the thickness of the wafer reaches the finished thickness after the wafer is divided into the individual device chips changes depending on the grinding condition of the grinding unit in the back surface grinding step (rotation speed and descent speed of the grinding unit, target finished thickness, material condition of the silicon wafer, and so forth). Therefore, when the back surface grinding step with a different grinding condition is carried out, the following lengths of modified layers and cracks are obtained in advance by experiment or the like: lengths with which the silicon wafer can be divided into the individual device chips before the thickness of the wafer reaches the target finished thickness and, after the wafer is divided into the individual device chips, damage due to rubbing of the individual device chips against each other is not caused in the time until the thickness of the wafer reaches this target finished thickness based on the grinding condition set in the back surface grinding step. Then, the power of the pulse laser beam with which the wafer is irradiated in the modified layer forming step is set to provide these lengths of modified layers and cracks.

The present invention is not limited to the details of the above described preferred embodiment. The scope of the invention is defined by the appended claim and all changes and modifications as fall within the equivalence of the scope of the claim are therefore to be embraced by the invention.

What is claimed is:

1. A wafer processing method for dividing a wafer on which a plurality of devices are formed on a front surface and are marked out by planned dividing lines into individual device chips, the wafer processing method comprising:
   a protective member disposing step of disposing a protective member on the front surface of the wafer;
   a modified layer forming step of positioning a light focus point of a pulse laser beam having such a wavelength as to be transmitted through the wafer on which the protective member is disposed at inside of the wafer along the planned dividing lines and irradiating the wafer with the pulse laser beam with predetermined power to form modified layers and cracks extending from the modified layers toward the front surface and a back surface; and
   a back surface grinding step of, after carrying out the modified layer forming step, holding a side of the protective member on a chuck table and grinding the back surface of the wafer by a grinding wheel under a predetermined grinding condition to divide the wafer into the individual device chips and carrying out grinding until the modified layers are removed and thickness of the wafer reaches a target finished thickness,
   wherein the predetermined power of the pulse laser beam set in the modified layer forming step is set to a power that forms the modified layers and the cracks in such a manner that the wafer is allowed to be divided into the individual device chips before the thickness of the wafer reaches the target finished thickness and, after the wafer is divided into the individual device chips, a time until the thickness of the wafer reaches the target finished thickness is such a time that damage due to rubbing of the individual device chips against each other is not caused through grinding under the predetermined grinding condition set in the back surface grinding step.

* * * * *